(12) United States Patent
Lin et al.

(10) Patent No.: US 8,866,301 B2
(45) Date of Patent: Oct. 21, 2014

(54) PACKAGE SYSTEMS HAVING INTERPOSERS WITH INTERCONNECTION STRUCTURES

(75) Inventors: Yung-Chi Lin, Su-Lin (TW); Jing-Cheng Lin, Chu Tung Zhen (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 217 days.

(21) Appl. No.: 12/781,960

(22) Filed: May 18, 2010

(65) Prior Publication Data

US 2011/0285005 A1 Nov. 24, 2011

(51) Int. Cl.
| | |
|---|---|
| *H01L 23/48* | (2006.01) |
| *H01L 23/52* | (2006.01) |
| *H01L 29/40* | (2006.01) |
| *H01L 23/02* | (2006.01) |
| *H01L 23/498* | (2006.01) |
| *H01L 23/538* | (2006.01) |
| *H01L 23/00* | (2006.01) |
| *H01L 23/31* | (2006.01) |
| *H01L 21/56* | (2006.01) |
| *H01L 23/29* | (2006.01) |
| *H01L 21/48* | (2006.01) |

(52) U.S. Cl.
CPC . *H01L 23/49827* (2013.01); *H01L 2924/01073* (2013.01); *H01L 2224/16225* (2013.01); *H01L 2924/01082* (2013.01); *H01L 2224/73203* (2013.01); *H01L 2924/01078* (2013.01); *H01L 2924/01023* (2013.01); *H01L 2924/10329* (2013.01); *H01L 2924/01013* (2013.01); *H01L 23/5389* (2013.01); *H01L 2924/01024* (2013.01); *H01L 2924/01049* (2013.01); *H01L 2924/01327* (2013.01); *H01L 23/49822* (2013.01); *H01L 23/49816* (2013.01); *H01L 2924/01079* (2013.01); *H01L 2924/01033* (2013.01); *H01L 24/24* (2013.01); *H01L 23/3128* (2013.01); *H01L 2924/01032* (2013.01); *H01L 2924/01006* (2013.01); *H01L 21/56* (2013.01); *H01L 21/563* (2013.01); *H01L 23/295* (2013.01); *H01L 2224/73204* (2013.01); *H01L 2924/01019* (2013.01); *H01L 2924/0102* (2013.01); *H01L 2224/24227* (2013.01); *H01L 2924/01047* (2013.01); *H01L 21/565* (2013.01); *H01L 21/4846* (2013.01); *H01L 2924/10253* (2013.01); *H01L 2224/32225* (2013.01); *H01L 2924/01029* (2013.01); *H01L 2924/01059* (2013.01); *H01L 2924/15311* (2013.01); *H01L 2924/01074* (2013.01)

USPC ........... 257/774; 257/686; 257/690; 257/738; 257/E23.169; 257/E23.174; 257/E23.175

(58) Field of Classification Search
None
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |

(Continued)

OTHER PUBLICATIONS

Definition of adjacent. (n.d.) The American Heritage® Dictionary of the English Language, Fourth Edition. (2003). Retrieved Mar. 18, 2014 from http://www.thefreedictionary.com/adjacent.*

*Primary Examiner* — Michael Jung
(74) *Attorney, Agent, or Firm* — Slater & Matsil, L.L.P.

(57) ABSTRACT

A package system includes a first integrated circuit disposed over an interposer. The interposer includes at least one molding compound layer including a plurality of electrical connection structures through the at least one molding compound layer. A first interconnect structure is disposed over a first surface of the at least one molding compound layer and electrically coupled with the plurality of electrical connection structures. The first integrated circuit is electrically coupled with the first interconnect structure.

21 Claims, 22 Drawing Sheets

(56) References Cited

U.S. PATENT DOCUMENTS

| | | |
|---|---|---|
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,518,089 B2* | 2/2003 | Coyle ............ 438/106 |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 6,987,031 B2* | 1/2006 | Eng et al. ............ 438/108 |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,332,822 B2* | 2/2008 | Basheer et al. ............ 257/787 |
| 7,335,972 B2 | 2/2008 | Chanchani |
| 7,355,273 B2 | 4/2008 | Jackson et al. |
| 7,358,607 B2* | 4/2008 | Figueroa et al. ............ 257/736 |
| 7,514,797 B2* | 4/2009 | Chen et al. ............ 257/777 |
| 8,035,218 B2* | 10/2011 | Guzek et al. ............ 257/700 |
| 2003/0047809 A1* | 3/2003 | Takeuchi et al. ............ 257/758 |
| 2006/0046464 A1* | 3/2006 | Miura et al. ............ 438/622 |
| 2006/0278968 A1* | 12/2006 | Yamano ............ 257/686 |
| 2007/0178686 A1* | 8/2007 | Honda ............ 438/597 |
| 2008/0116923 A1 | 5/2008 | Cheng et al. |
| 2008/0180123 A1 | 7/2008 | Cheng et al. |
| 2009/0245724 A1* | 10/2009 | Koizumi et al. ............ 385/14 |
| 2009/0293271 A1* | 12/2009 | Tanaka ............ 29/832 |
| 2010/0096738 A1* | 4/2010 | Simmons-Matthews et al. ............ 257/686 |
| 2011/0014746 A1* | 1/2011 | Do et al. ............ 438/107 |
| 2011/0037155 A1* | 2/2011 | Pagaila ............ 257/686 |
| 2011/0254160 A1* | 10/2011 | Tsai et al. ............ 257/738 |

* cited by examiner

PACKAGE SYSTEMS HAVING INTERPOSERS WITH INTERCONNECTION STRUCTURES

TECHNICAL FIELD

The present disclosure relates generally to the field of semiconductor package systems, and more particularly, to package systems having interposers.

BACKGROUND OF THE DISCLOSURE

Since the invention of integrated circuits, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

An additional limitation comes from the significant increase in the number and length of interconnections between devices as the number of devices increases. When the number and length of interconnections increase, both circuit resistance-capacitance (RC) delay and power consumption increase.

Three-dimensional integrated circuits (3D IC) are therefore created to resolve the above-discussed limitations. In a conventional formation process of 3D IC, two wafers, each including an integrated circuit, are formed. The wafers are then bonded with the devices aligned. Deep vias are then formed to interconnect devices on the first and second wafers.

Much higher device density has been achieved using 3D IC technology, and up to six layers of wafers have been bonded. As a result, the total wire length is significantly reduced. The number of vias is also reduced. Accordingly, 3D IC technology has the potential of being the mainstream technology of the next generation.

Conventional methods for forming 3D IC also include die-to-wafer bonding, wherein separate dies are bonded to a common wafer. An advantageous feature of the die-to-wafer bonding is that the size of the dies may be smaller than the size of chips on the wafer.

Recently, through-silicon-vias (TSVs), also referred to as through-wafer vias, are increasingly used as a way of implementing 3D IC. Conventionally, a bottom wafer is bonded to a top wafer. Both wafers include integrated circuits over substrates. The integrated circuits in the bottom wafer are connected to the integrated circuits in the wafer through interconnect structures. The integrated circuits in the wafers are further connected to external pads through through-silicon-vias. The stacked wafers can be subjected to a sawing process to provide a plurality of stacked die structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
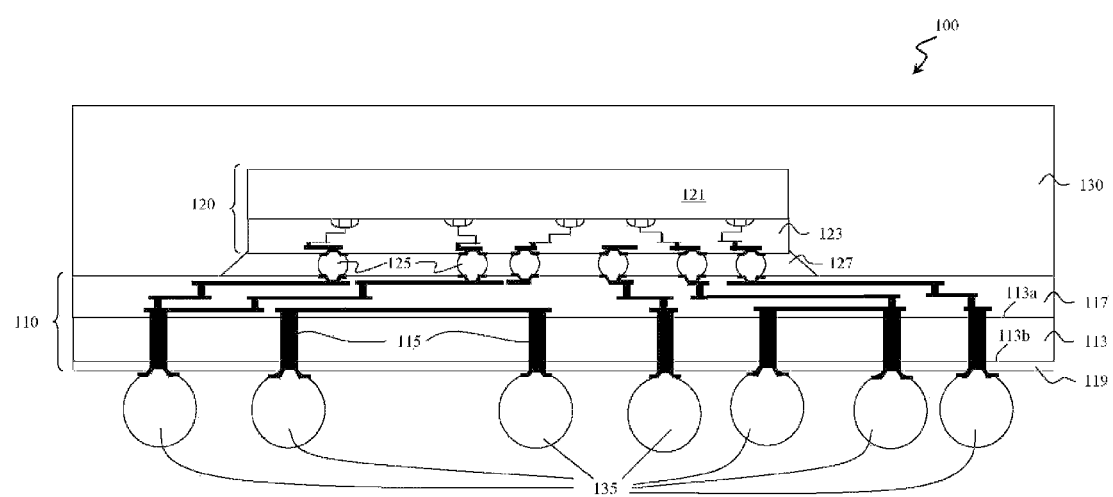
FIG. 1 is a schematic cross-sectional view of a first exemplary package system.

Conventionally, a package system has a silicon interposer disposed between a silicon die and an organic substrate. The silicon interposer has a plurality of through-silicon-via (TSV) structures for an electrical connection between the silicon die and the organic substrate. The formation of the TSV structures includes various processes, such as a TSV etch process, a barrier/seed layer deposition process, a copper plating process, a chemical-mechanical-polish (CMP) process for removing portions of the copper layer and barrier/seed layer, and/or other semiconductor processes. The formation of the TSV structures in the silicon interposer increases the cost of manufacturing the package system. It is found that a polyimide cap layer covering the silicon die is disposed over the silicon interposer. The applicants also found that a coefficient of thermal expansion (CTE) mismatch exists between the polyimide cap layer and the silicon interposer may result in an intermetal dielectric (IMD) layer delamination of the silicon die and/or a bump failure at least during an assembly process and/or a reliability test.

Based on the foregoing, package systems for integrated circuits are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view of a first exemplary package system. In FIG. 1, a package system can include at least one integrated circuit, e.g., an integrated circuit 120, disposed over an interposer 110. The integrated circuit 120 can be electrically coupled with the interposer 110. In some embodiments, a cap layer 130 can be disposed over the interposer 110 and cover the integrated circuit 120.

In some embodiments, the interposer 110 can include at least one molding compound layer, e.g., a molding compound layer 113. The molding compound layer 113 can include a plurality of electrical connection structures, e.g., electrical connection structures 115. The electrical connection structures 115 can be disposed through the molding compound layer 113. An interconnect structure 117 can be disposed over a surface 113a of the molding compound layer 113 and electrically coupled with the electrical connection structures 115. In some embodiments, the interposer 110 can include at least one passive device, e.g., a capacitor, a resistor, and/or an inductor. In other embodiments, the interposer 110 can be substantially free from including any active device, e.g., metal-oxide-semiconductor (MOS) transistors, bipolar junction transistors (BJTs), complementary MOS (CMOS) transistors, etc. In still other embodiments, the interposer 110 does not include any active device and passive device. The interposer 110 can be merely configured for providing an electrical connection. Though only one molding compound layer 113 is shown in FIG. 1, the scope of this application is not limited thereto. In other embodiments, two or more molding compound layers can be used.

In some embodiments, the molding compound layer 113 can be made of at least one material, such as a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the molding compound layer 113 can be made of epoxy resin, such as epoxy cresol novolac (ECN), biphenyl epoxy resin, multifunctional liquid epoxy resin, or any combinations thereof. In still other embodiments, the molding compound layer 113 can be made of epoxy resin optionally including one or more fillers to provide the composition with any of a variety of desirable properties. Examples of fillers can be aluminum, titanium dioxide, carbon black, calcium carbonate, kaolin clay, mica, silica, talc, wood flour, or any combinations thereof.

In some embodiments, the electrical connection structures 115 can be disposed through the molding compound layer 113. For example, the electrical connection structures 115 can continuously extend from the surface 113b of the molding compound layer 113 to the surface 113a. In other embodiments, the electrical connection structures 115 can be disposed straight through the molding compound layer 113. In still other embodiments, at least one of the electrical connection structures 115 can have one or more turns in the molding compound layer 113. The electrical connection structures 115 may each be a line, a pillar, a layer, one or more geometric structure, or any combinations thereof.

In some embodiments, the electrical connection structures 115 can be electrically coupled with a plurality of connectors, e.g., bumps 135. In some embodiments, the electrical connection structures 115 can be made of at least one material, such as conductive material (aluminum, copper, aluminum-copper, polysilicon, other conductive material, and/or any combinations thereof), other materials that are suitable for forming the electrical connection structures 115, and/or combinations thereof.

In some embodiments, the interconnect structure 117 can include at least one dielectric layer, at least one electrical connection structure, and a passivation layer (not labeled). In some embodiments, the interconnect structure 117 can include multiple dielectric layers and multiple layers of electrical connection structures. Each layer of the electrical connection structures can be sandwiched by two of the dielectric layers. In some embodiments, the dielectric layers and the conductive structures can be configured to form various passive devices, e.g., capacitors, resistors, and/or inductances.

In some embodiments, the dielectric layer (not labeled) may include at least one material, such as silicon oxide, silicon nitride, silicon oxynitride, low-k dielectric material, ultra low-k dielectric material, one or more dielectric materials, or any combinations thereof. The electrical connection structures can include at least one structure, such as via plugs, contact plugs, damascene structures, dual damascene structures, metallic regions, metallic lines, or any combinations thereof. The via plugs, contact plugs, damascene structures, dual damascene structures, metallic regions, and metallic lines (not labeled) can be made of at least one material, such as tungsten, aluminum, copper, titanium, tantalum, titanium nitride, tantalum nitride, nickel silicide, cobalt silicide, other proper conductive materials, and/or combinations thereof. In some embodiments, the at least one electrical connection structure can be referred to as a redistribution layer (RDL).

In some embodiments, the interconnect structure 117 can include at least one pad (not labeled) that can be disposed on a surface of the interconnect structure 117. At least one connector, e.g., bumps 125, can each be disposed over its corresponding pad for electrical connection with integrated circuit 120. The at least one pad may be made of at least one material, such as copper (Cu), aluminum (Al), aluminum copper (AlCu), aluminum silicon copper (AlSiCu), or other conductive material or various combinations thereof. In some embodiments, the at least pad may include an under bump metallization (UBM) layer.

In some embodiments, the bumps 125 and 135 can each include at least one material, such as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. By using the interposer 110, the pitch of the bumps 125 can be fanned out to the pitch of the bumps 135 through the interconnect structure 117 and/or the molding compound layer 113.

Referring again to FIG. 1, the integrated circuit 120 can be disposed over the interposer 110. The integrated circuit 120 can be electrically coupled with the electrical connection structures 115 through the bumps 125 and the interconnect structure 117. The integrated circuit 120 can include at least one active device, e.g., transistors, MOS transistors, BJTs, CMOS transistors, other active devices, or any combinations thereof. In some embodiments, the integrated circuit 120 can include a substrate 121 and an interconnect structure 123. The interconnect structure 123 can be disposed adjacent a surface of the substrate 121. Though merely showing a single integrated circuit 120 disposed over the interposer 110, the scope of this application is not limited thereto. In some embodiments, two or more integrated circuits can be horizontally separated and/or vertically stacked over the interposer 110.

In some embodiments, the substrate 121 can be made of an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI). In some examples, the semiconductor substrate may include a doped epi layer or a buried layer. In other examples, the compound semiconductor substrate may have a multilayer structure, or the substrate may include a multilayer compound semiconductor structure.

In some embodiments, the interconnect structure 123 can include at least one dielectric layer, at least one electrical connection structure, and at least one passivation layer. In some embodiments, the interconnect structure 123 can include multiple dielectric layers and multiple layers of electrical connection structures. Each layer of the electrical connection structures can be sandwiched by the dielectric layers. In some embodiments, the dielectric layers and the conductive structures can be configured to form various passive devices, e.g., capacitors, resistors, and/or inductances.

In some embodiments, the dielectric layer (not labeled) may include at least one material, such as silicon oxide, silicon nitride, silicon oxynitride, low-k dielectric material, ultra low-k dielectric material, one or more other dielectric materials, or any combinations thereof. The electrical connection structures can include at least one structure, such as via plugs, contact plugs, damascene structures, dual damascene structures, metallic regions, metallic lines, or any combinations thereof. The via plugs, contact plugs, damascene structures, dual damascene structures, metallic regions, and metallic lines (not labeled) can be made of at least one material, such as tungsten, aluminum, copper, titanium, tantalum, titanium nitride, tantalum nitride, nickel silicide, cobalt silicide, other proper conductive materials, and/or combinations thereof.

In some embodiments, the interconnect structure 123 can include at least one pad (not labeled) that can be disposed adjacent a surface of the interconnect structure 123. The at least one pad may be made of at least one material, such as copper (Cu), aluminum (Al), aluminum copper (AlCu), aluminum silicon copper (AlSiCu), or other conductive material or various combinations thereof. In some embodiments, the at least pad may include an under bump metallization (UBM) layer.

In some embodiments, the interposer 110 can optionally include at least one passivation structure, e.g., passivation structure 119. The passivation structure 119 can be disposed below a surface 113b of the molding compound layer 113. In some embodiments, the passivation structure 119 can include at least one dielectric layer and/or at least one passivation layer.

In some embodiments, an underfill material 127 can be disposed between the interposer 110 and the integrated circuit 120. The underfill material 127 can be made of at least one material, such as a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the underfill material 127 can be made of epoxy resin, such as epoxy cresol novolac (ECN), biphenyl epoxy resin, multifunctional liquid epoxy resin, or any combinations thereof. In still other embodiments, the underfill material 127 can be made of epoxy resin optionally including one or more fillers to provide the composition with any of a variety of desirable properties. Examples of fillers can be aluminum, titanium dioxide, carbon black, calcium carbonate, kaolin clay, mica, silica, talc, wood flour, or any combinations thereof.

In some embodiments, a coefficient of thermal expansion (CTE) of the underfill material 127 can be substantially equal to the CTE of the molding compound layer 113. The phrase "the CTE of the underfill material 127 can be substantially equal to the CTE of the molding compound layer 113" can represent that the CTE mismatch between the underfill material 127 and the molding compound layer 113 does not result in the intermetal dielectric (IMD) layer delamination of the integrated circuit 120 and/or a bump failure of the bumps 125 at least during an assembly process and/or a reliability test.

Referring to FIG. 1, the cap layer 130 can be disposed over the interposer 110 and cover the integrated circuit 120. The cap layer 130 can be made of at least one material, such as a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the cap layer 130 can be made of epoxy resin, such as epoxy cresol novolac (ECN), biphenyl epoxy resin, multifunctional liquid epoxy resin, or any combinations thereof. In still other embodiments, the cap layer 130 can be made of epoxy resin optionally including one or more fillers to provide the composition with any of a variety of desirable properties. Examples of fillers can be aluminum, titanium dioxide, carbon black, calcium carbonate, kaolin clay, mica, silica, talc, wood flour, or any combinations thereof.

In some embodiments, a coefficient of thermal expansion (CTE) of the cap layer 130 can be substantially equal to the CTE of the molding compound layer 113. The phrase "the CTE of the cap layer 130 can be substantially equal to the CTE of the molding compound layer 113" can represent that the CTE mismatch between the cap layer 130 and the molding compound layer 113 does not result in a low-k intermetal dielectric (IMD) layer delamination of the integrated circuit 120 and/or a bump failure of the bumps 125 at least during an assembly process and/or a reliability test.

Figure 2:
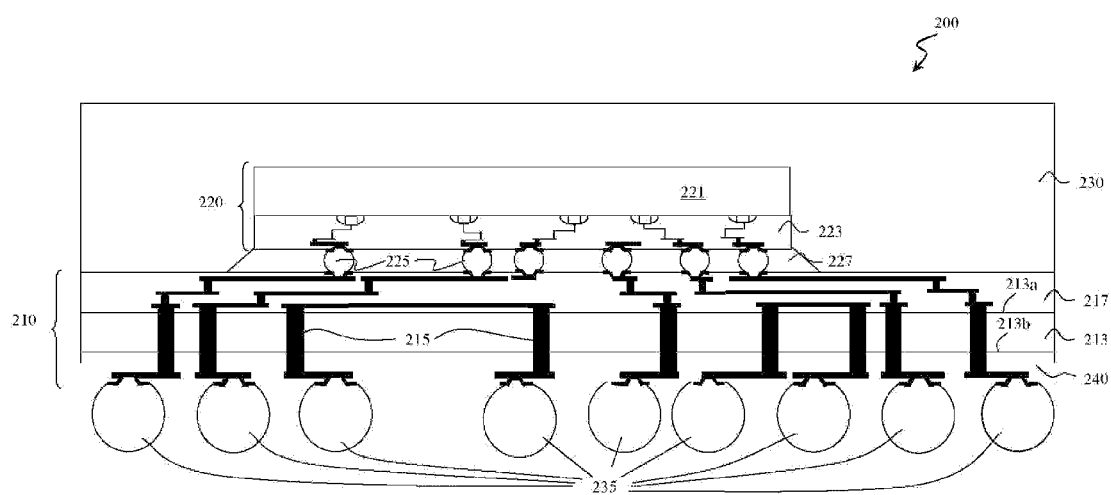
FIG. 2 is a schematic cross-sectional view of a second exemplary package system.

FIG. 2 is a schematic cross-sectional view of a second exemplary embodiment. Items of FIG. 2 that are the same or similar items in FIG. 1 are indicated by the same reference numerals, increased by 100. In FIG. 2, a package system 200 can include an interconnect structure 240 below a surface 213b of a molding compound layer 213. In some embodiments, the metallic line pitch of the interconnect structure 240 can be larger than the metallic line pitch of the interconnect structure 217. The metallic line pitch of the interconnect structure 217 can be fanned out to the metallic line pitch of the interconnect structure 240.

In some embodiments, the interconnect structure 240 can include at least one dielectric layer, at least one electrical connection structure and at least one passivation layer. In some embodiments, the interconnect structure 240 can include multiple dielectric layers and multiple layers of electrical connection structures. Each layer of the electrical connection structures can be sandwiched by the dielectric layers. In some embodiments, the dielectric layers and the conductive structures can be configured to form various passive devices, e.g., capacitors, resistors, and/or inductances.

In some embodiments, the dielectric layer (not labeled) may include at least one material, such as silicon oxide, silicon nitride, silicon oxynitride, low-k dielectric material, ultra low-k dielectric material, another dielectric material, or any combinations thereof. The electrical connection structures can include at least one structure, such as via plugs, contact plugs, damascene structures, dual damascene structures, metallic regions, metallic lines, or any combinations thereof. The via plugs, contact plugs, damascene structures, dual damascene structures, metallic regions, and metallic lines (not labeled) can be made of at least one material, such as tungsten, aluminum, copper, titanium, tantalum, titanium nitride, tantalum nitride, nickel silicide, cobalt silicide, other proper conductive materials, and/or combinations thereof.

In some embodiments, the interconnect structure 240 can include at least one pad (not labeled) that can be disposed adjacent a surface of the interconnect structure 240. At least one connector, e.g., bumps 235, can each be disposed over its corresponding pad for electrical connection with one or more substrates (not shown). The at least one pad may be made of at least one material, such as copper (Cu), aluminum (Al), aluminum copper (AlCu), aluminum silicon copper (AlSiCu), or other conductive material or various combinations thereof. In some embodiments, the at least pad may include an under bump metallization (UBM) layer.

Figure 3:
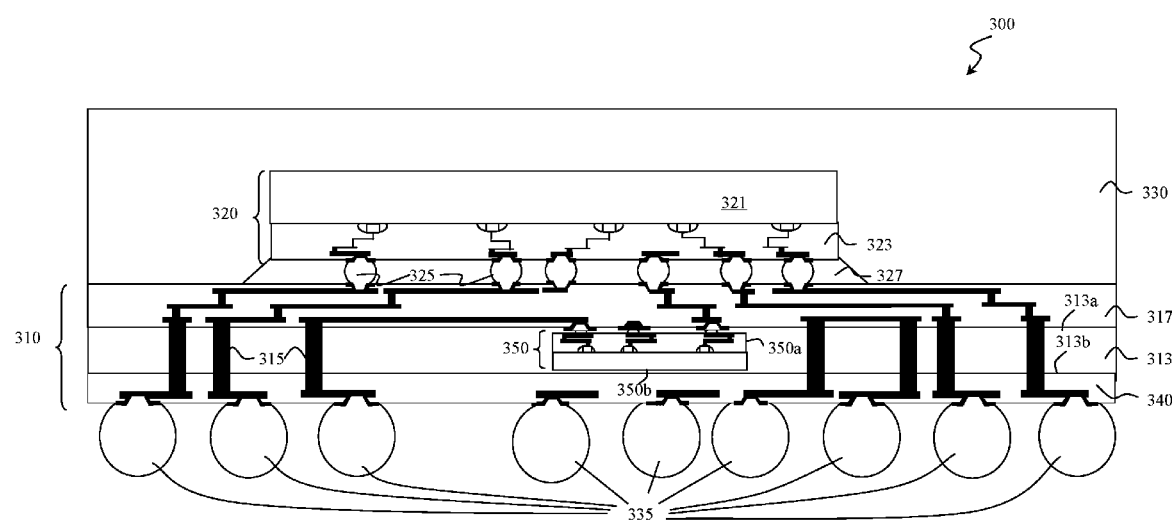
FIG. 3 is a schematic cross-sectional view of a third exemplary package system.

FIG. 3 is a schematic cross-sectional view of a third exemplary embodiment. Items of FIG. 3 that are the same or similar items in FIG. 2 are indicated by the same reference numerals, increased by 100. In FIG. 3, a package system 300 can include integrated circuits 320 and 350. The integrated circuit 320 can be electrically coupled with an interconnect structure 317 through at least one connector, e.g., bumps 325. The integrated circuit 350 can be electrically coupled with an interconnect structure 317 through at least one connector, e.g., bumps (not labeled). In some embodiments, the integrated circuit 350 can be electrically coupled with the integrated circuit 320 through the interconnect structure 317 and bumps 325. In other embodiments, the integrated circuit 350 can be electrically coupled with at least one connector, e.g., bumps 335, through the interconnect structures 317 and 340 and electrical connection structures 315. In some embodiments, the integrated circuit 320 can be referred to as a tier-1 die and the integrated circuit 350 can be referred to as a tier-2 die.

In one embodiment, at least one molding compound layer, e.g., an molding compound layer 313, can be disposed at least partially around at least one side edge, e.g., an side edge 350a, of the integrated circuit 350. In this exemplary embodiment, a surface 313b of the molding compound layer 313 can be higher than a surface 350b of the integrated circuit 350. In other embodiments, the surface 313b of the molding compound layer 313 can be substantially level with the surface 350b of the integrated circuit 350. In still other embodiments, the integrated circuit 350 can be disposed within the molding compound layer 313 as shown in FIG. 3. The integrated circuit 350 can be substantially fully surrounded by the molding compound layer 313.

In some embodiments, the integrated circuit 350 can include at least one active device, e.g., transistors, MOS transistors, BJTs, CMOS transistors, other active devices, or any combinations thereof. In some embodiments, the integrated circuit 350 can include a substrate (not labeled) and an interconnect structure (not labeled). The interconnect structure can be disposed adjacent a surface of the substrate. In some embodiments, the metallic line pitch of the interconnect structure of the integrated circuit 350 can be smaller than the metallic line pitch of the interconnect structure 317. The metallic line pitch of the interconnect structure of the integrated circuit 350 can be fanned out to the metallic line pitch of the interconnect structure 317.

In some embodiments, the substrate and the interconnect structure of the integrated circuit 350 can be made of materials similar to those of the substrate 121 and the interconnect structure 123, respectively, described above in conjunction with FIG. 1. In other embodiments, the connectors disposed between the integrated circuit 350 and the interconnect structure 317 can be made of the same or similar materials of the bumps 125 described above in conjunction with FIG. 1.

Figure 4:
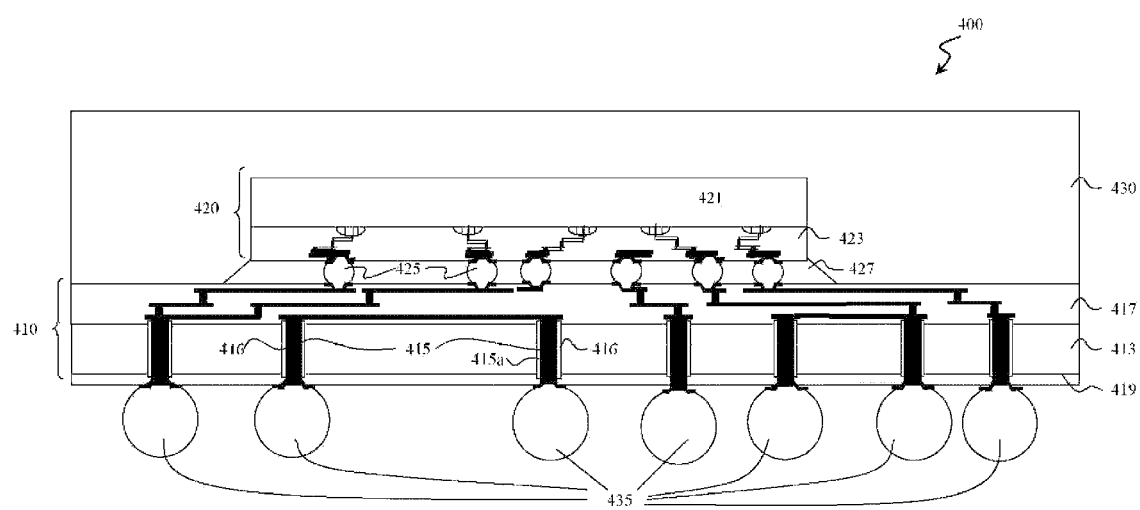
FIG. 4 is a schematic cross-sectional view of a fourth exemplary package system.

FIG. 4 is a schematic cross-sectional view of a fourth exemplary embodiment. Items of FIG. 4 that are the same or similar items in FIG. 1 are indicated by the same reference numerals, increased by 300. In FIG. 4, a package system can include a plurality of barrier structures, e.g., barrier structures 416, each of which is disposed around at least one side edge, e.g., a side edge 415a, of one of electrical connection structures 415. The barrier structures 416 can prevent reaction between the electrical connection structures 415 and at least one molding compound layer, e.g., a molding compound layer 413. In some embodiments, the barrier structures 416 can be made of at least one material, such as a barrier material (e.g., titanium, titanium-nitride, tantalum, tantalum-nitride, other barrier material, and/or any combinations thereof). It is noted that the barrier structures 416 can be used in the package systems 100-300 described above in conjunction with FIGS. 1-3, respectively.

FIGS. 5A-5L are schematic cross-sectional views illustrating an exemplary method of forming an exemplary interposer that is similar to the interposer shown in FIG. 1. Items of FIGS. 5A-5L that are the same or similar items in FIG. 1 are indicated by the same reference numerals, increased by 400. Though merely showing a formation of a single interposer, the scope of this application is not limited thereto. In some embodiments, a plurality of interposers can be defined by the methods described below.

Figure 5A:
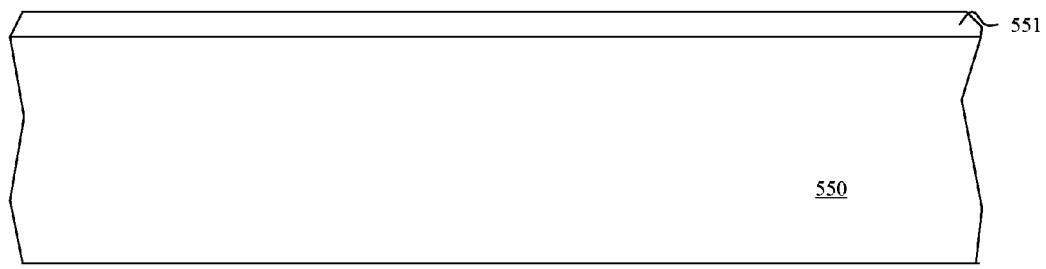
FIGS. 5A-5L are schematic cross-sectional views illustrating an exemplary method of forming an exemplary interposer that is similar to the interposer shown in FIG. 1.

In FIG. 5A, a dielectric layer 551 can be formed over a substrate 550. In some embodiments, the dielectric layer 551 can be referred to as an etch stop layer. The substrate 550 can be a wafer substrate, e.g., an 8-inch, 12-inch, larger wafer substrate, or another wafer substrate, and have an etch selectivity that is different from an etch selectivity of the dielectric layer 551. In some embodiments, the dielectric layer 551 can be a portion of an interconnect structure 517 (shown in FIG. 5B).

In some embodiments, the substrate 550 can be made of an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. The dielectric layer 551 can be made from at least one material, such as silicon oxide, silicon nitride, silicon oxynitride (SiON), silicon oxycarbide (SiOC), silicon carbon nitride (SiCN), silicon carbon oxynitride (SiCON), silicon carbide (SiC), other dielectric materials, or any combinations thereof. The dielectric layer 551 can be formed, for example, by chemical vapor deposition (CVD), e.g., low pressure CVD (LPCVD), atomic layer CVD (ALCVD), ultrahigh vacuum CVD (UHVCVD), reduced pressure CVD (RPCVD), or any suitable process.

Figure 5B:
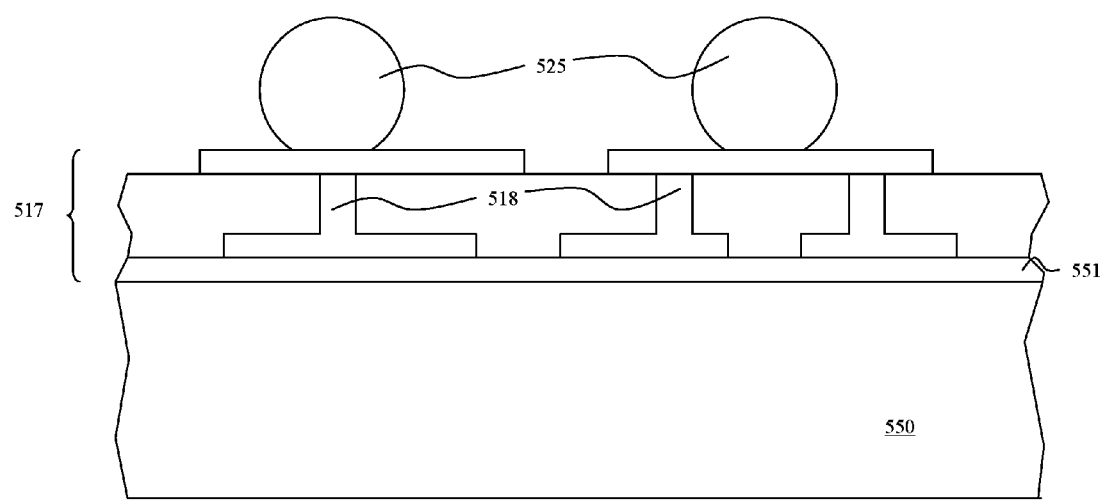

Referring to FIG. 5B, an interconnect structure 517 can be formed over the substrate 550. The interconnect structure 517 can include at least one electrical connection structure, e.g., electrical connection structures 518. The electrical connection structures can include at least one of contact plugs, via plugs, metallic lines, or any combinations thereof. In some embodiments, the electrical connection structures 518 can be referred to as a redistribution layer (RDL). The interconnect structure 517 can be formed by at least one of deposition processes, photolithographic processes, etch processes, chemical-mechanical polish (CMP) processes, cleaning process, other known semiconductor processes, or any combinations thereof.

In some embodiments, a plurality of pads (not labeled) can be formed adjacent to a surface of the interconnect structure 517. In other embodiments, the pads can be optionally subjected to an electroless nickel immersion gold (ENIG) process or an immersion tin (Im-Sn) process for forming ENIG or Im-Sn material on the exposed surfaces of the pads. The ENIG or Im-Sn material can serve as a bonding interface between the pads and connectors, e.g., bumps 525.

Figure 5C:
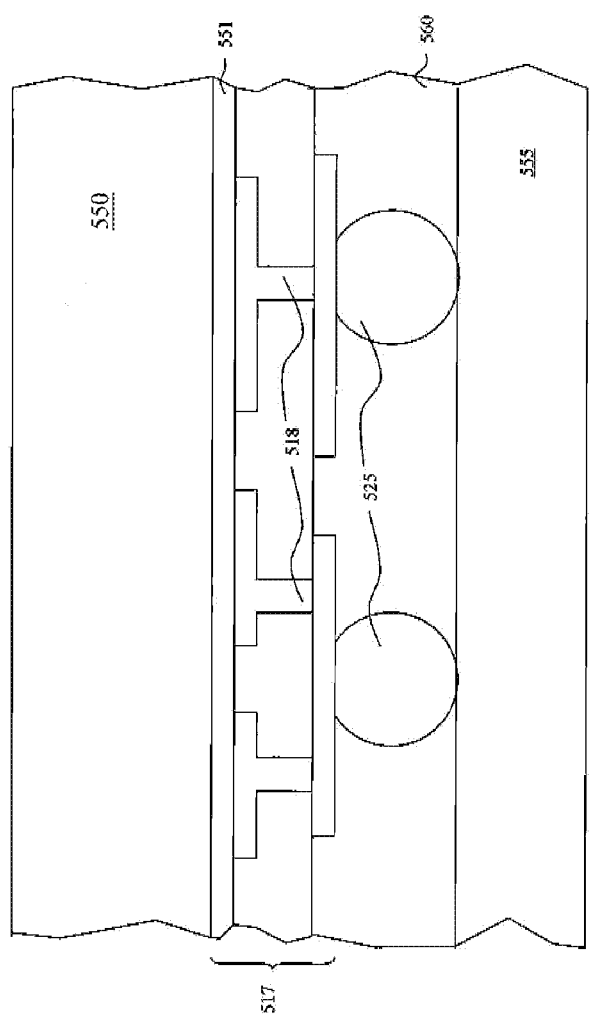

Referring to FIG. 5C, the structure shown in FIG. 5B is flipped and disposed over a carrier 555, e.g., a glass substrate. In some embodiments, the structure shown in FIG. 5B can be attached on a glue layer 560 that is disposed over the carrier 555. The glue layer 560 can include a material such as a thermosetting resin to facilitate connection between the carrier 555 and the substrate 550.

Figure 5D:
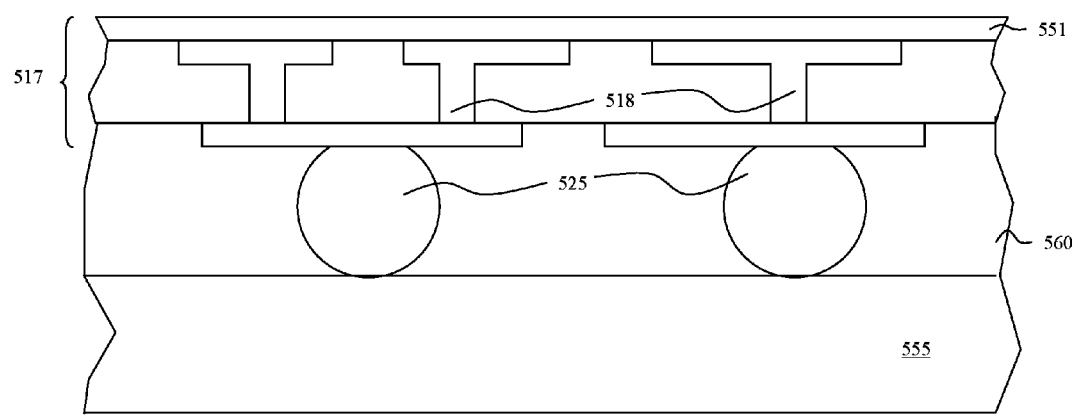

Referring to FIG. 5D, a removing process can remove the substrate 550 (shown in FIG. 5C). The removing process can include a wet etch process, a dry etch process, or any combinations thereof. In some embodiments, the removing process can include a wet etch process that has an etch selectivity to the substrate 550 higher than an etch selectivity to the dielectric layer 551. The dielectric layer 551 can serve as an etch stop layer for the removing process. In other embodiments, the removing process can be performed in a wet bench. The wet bench can process a plurality of wafer substrates during a single removing process.

Figure 5E:
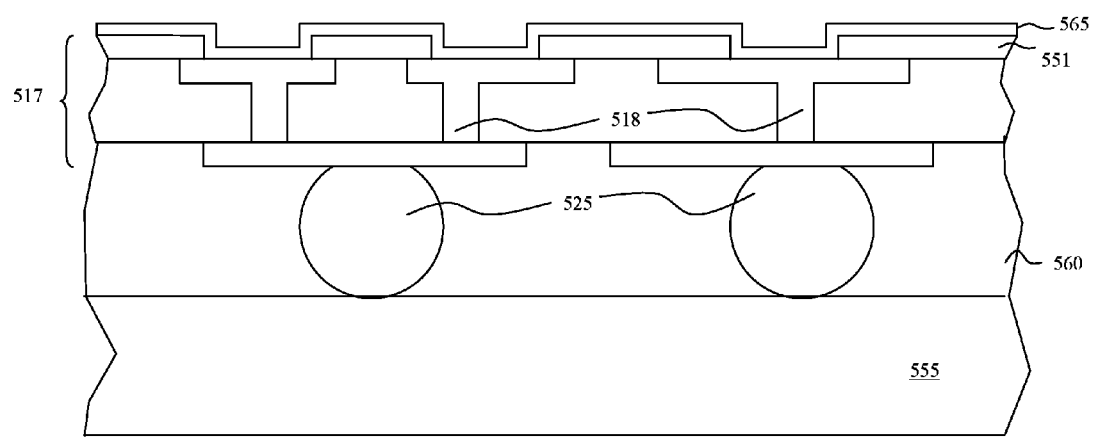

Referring to FIG. 5E, a plurality of openings (not labeled) can be defined in the dielectric layer 551, exposing at least portions of the electrical connection structures 518. At least one UBM layer, e.g., a UBM layer 565, can be formed substantially conformal over the dielectric layer 551. The UBM layer 565 can be made of at least one material such as, aluminum, copper, titanium, nickel, tungsten, gold, chromium, vanadium, one or more alloys made thereof, or any combinations thereof. The UBM layer 565 can be made, for example, by physical vapor deposition (PVD), CVD, electrical plating, electroless plating, or any combinations thereof. In some embodiments, the process of forming the UBM layer 565 can include an electroless nickel immersion gold (ENIG) process or an immersion tin (Im-Sn) process for forming ENIG or Im-Sn material on the surface of the UBM layer 565.

Figure 5F:
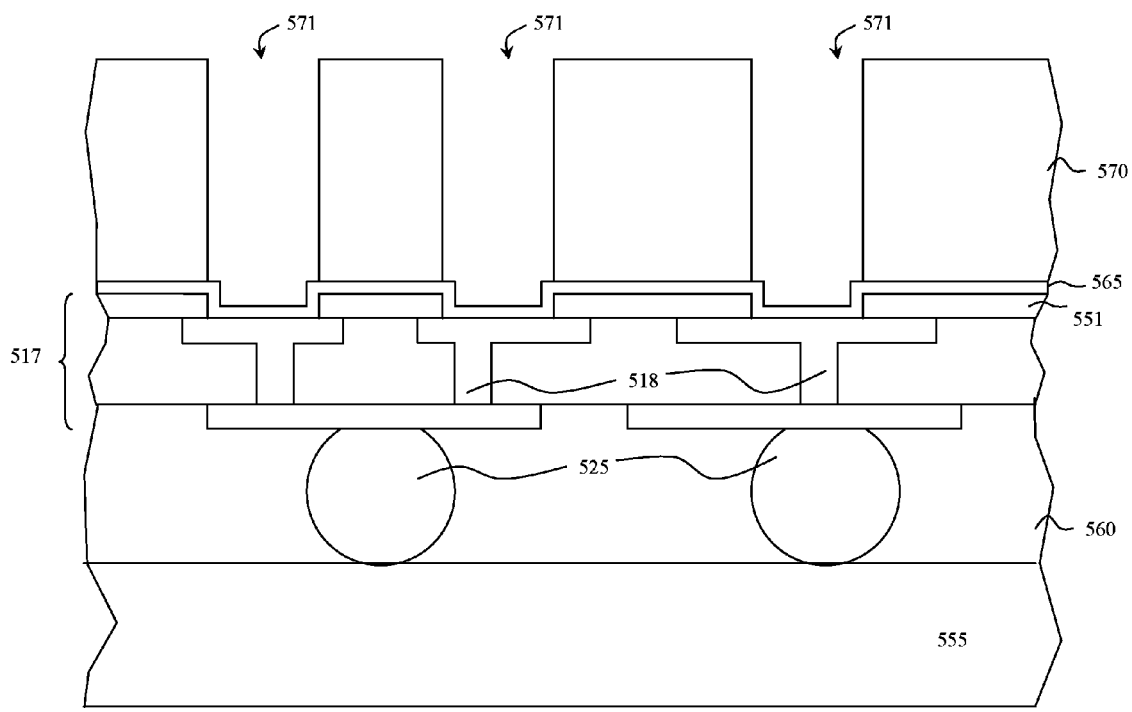

Referring to FIG. 5F, a patterned film 570, e.g., a dry film or a photoresist (PR) layer, can be formed over the UBM layer 565. The patterned film 570 can include openings 571 exposing portions of the UBM layer 565.

Figure 5G:
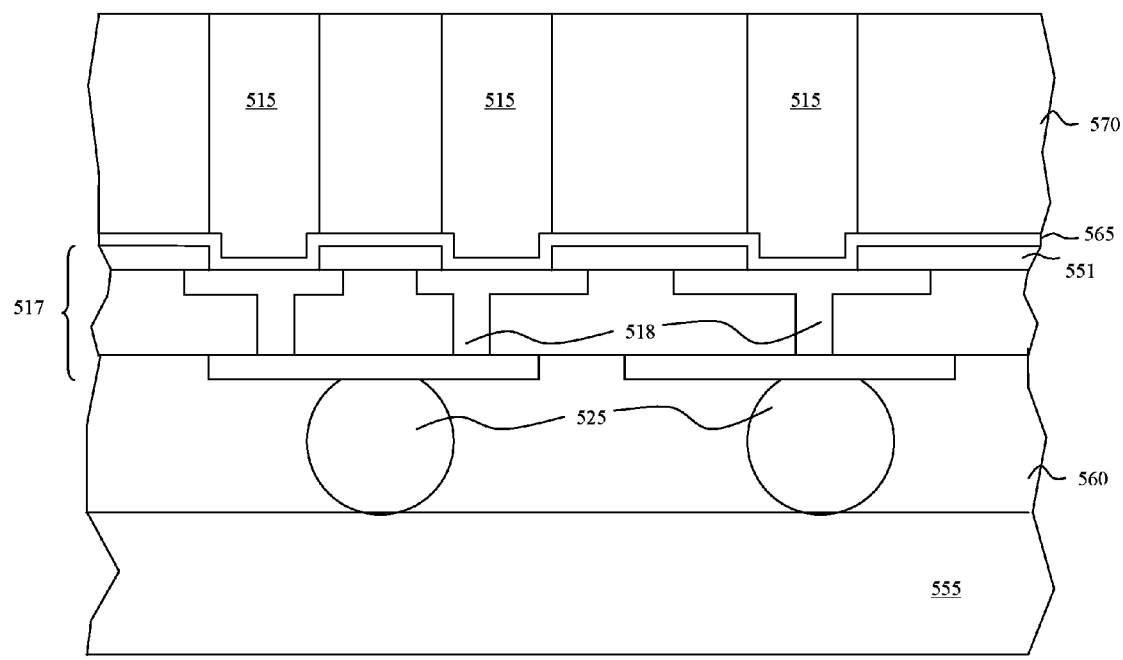

Referring to FIG. 5G, electrical connection structures 515 can each be formed in one of the openings 571. In some embodiments, the process of forming the electrical connection structures 515 can include selectively plating the electrical connection structures 515 from the exposed surface of the UBM layer 565. Since the electrical connection structures 515 can grow from the bottom to the top of the openings 571, each of the electrical connection structures 515 can be free from having a gap therein.

Figure 5H:
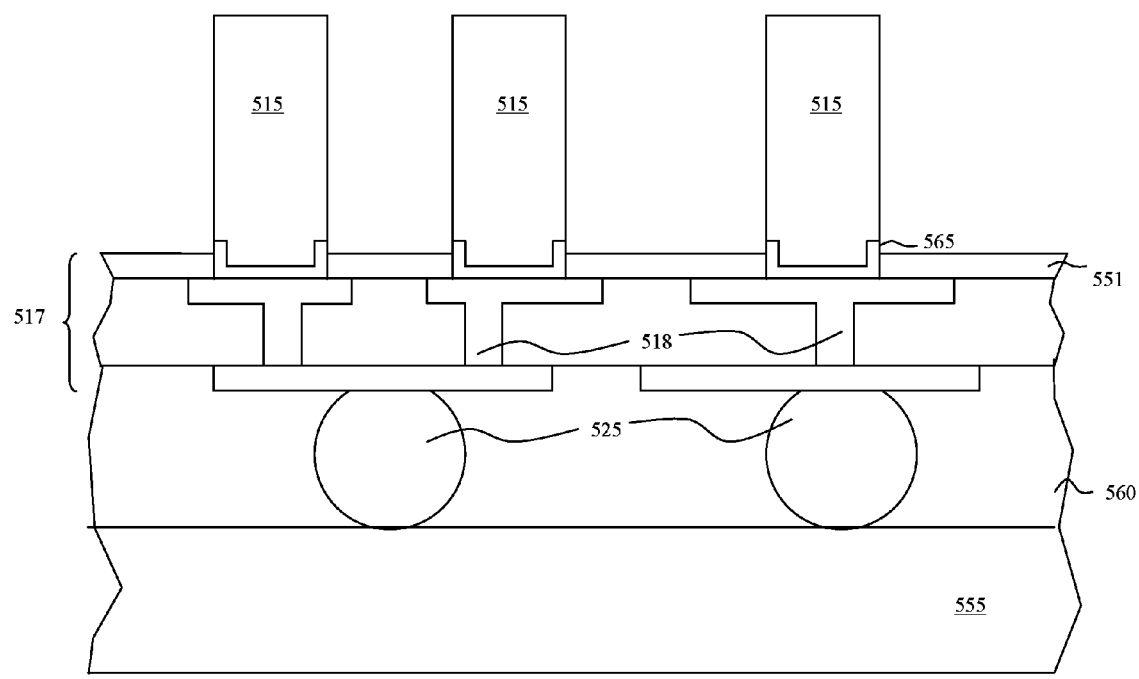

Referring to FIG. 5H, a removing process can remove the patterned film 570. Another removing process can remove portions of the UBM layer 565 that are not covered by the electrical connection structures 515. Sidewalls of the electrical connection structures 515 can be exposed. The removing processes can include at least one dry etch process, at least one wet etch process, or any combinations thereof.

In some embodiments, the barrier structures 416 (shown in FIG. 4) are optionally formed around the sidewalls of the electrical connection structures 515. The exposed sidewalls of the electrical connection structures 515 can be optionally subjected to an electrical plating or electroless plating to form the barrier structures 416 each around one of the electrical connection structures 515.

Figure 5I:
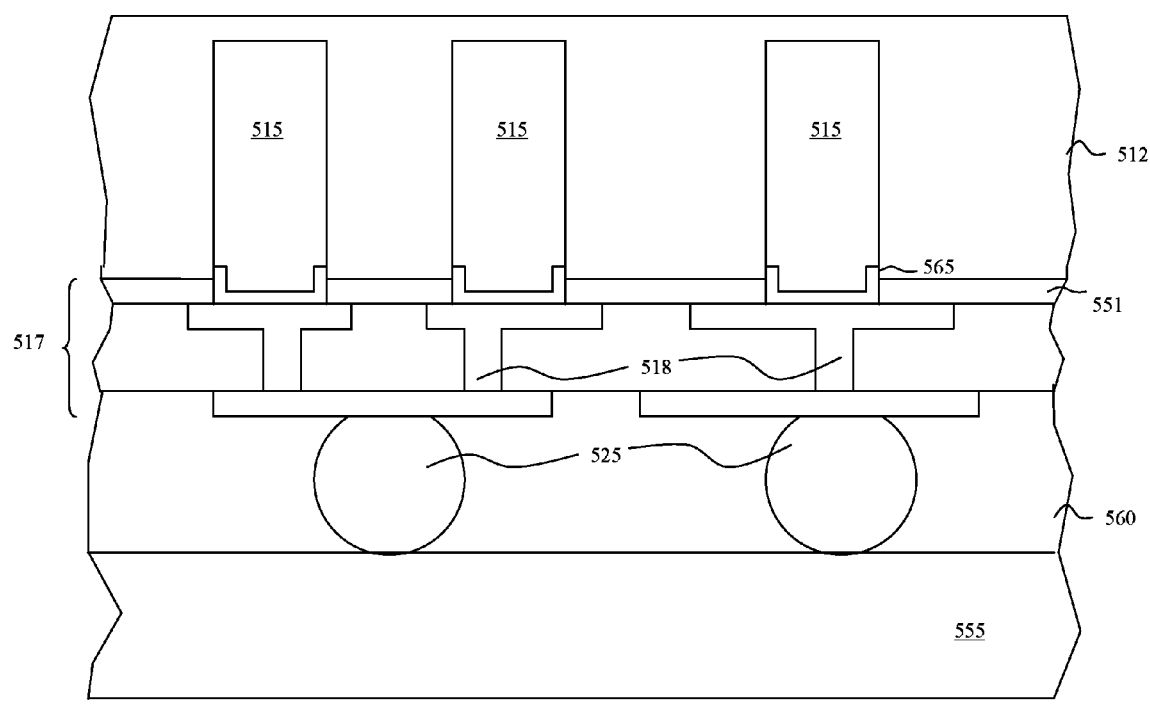

Referring to FIG. 5I, a molding compound material 512 can be formed, covering the electrical connection structures 515. In some embodiments, a liquid or viscous molding compound material 512 can be applied in spaces between and over the electrical connection structures 515 by any known equipment or methods.

Figure 5J:
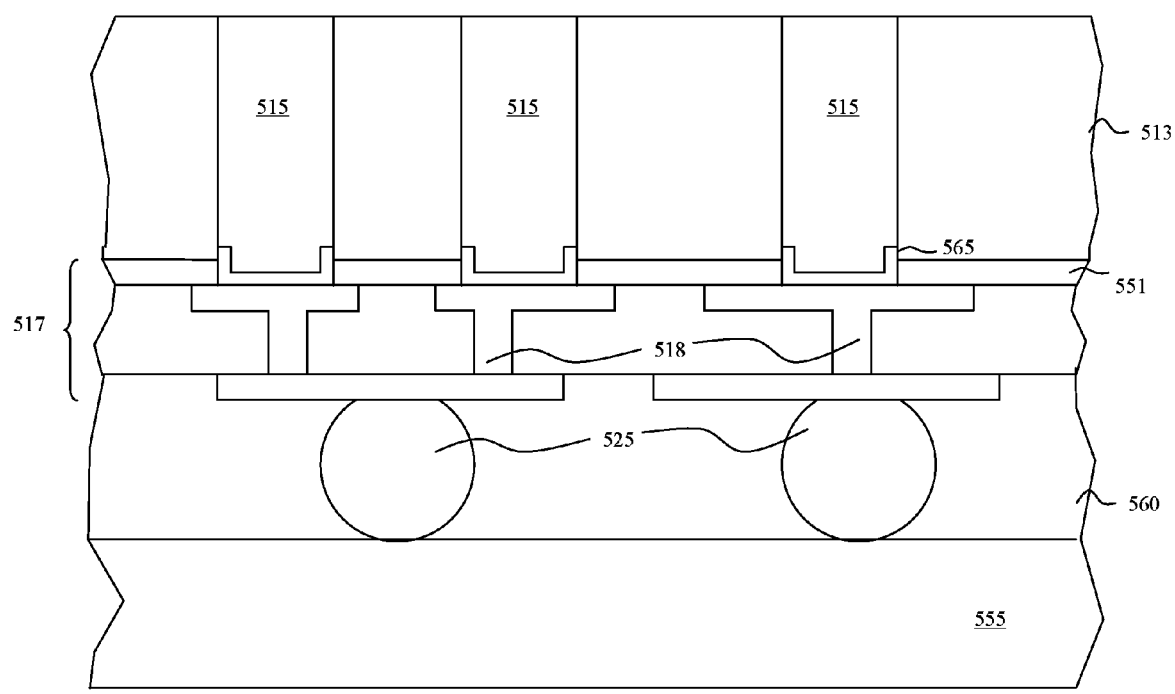

Referring to FIG. 5J, a removing process can remove a portion of the liquid or viscous molding compound material 512 that is over the electrical connection structures 515 so as to form the molding compound layer 513. The removing process can expose the surfaces of the electrical connection structures 515. The molding compound layer 513 can be formed in the spaces between the electrical connection structures 515. In some embodiments, the process of removing the portion of the molding compound material 512 can include a grinding process, an etch process, a polish process, one or more other removing steps, and/or any combinations thereof. In some embodiments, after removing the portion of the molding compound material 512, the molding compound layer 513 can be cured and/or hardened by any known thermal curing technique.

In some embodiments, an interconnect structure 240 (shown in FIG. 2) can be optionally formed over the structure shown in FIG. 5J. The interconnect structure 240 can be electrically coupled with the interconnect structure 517 through the electrical connection structures 515. The interconnect structure 240 can be formed by at least one of deposition processes, photolithographic processes, etch processes, chemical-mechanical polish (CMP) processes, cleaning process, other known semiconductor processes, or any combinations thereof.

Figure 5K:
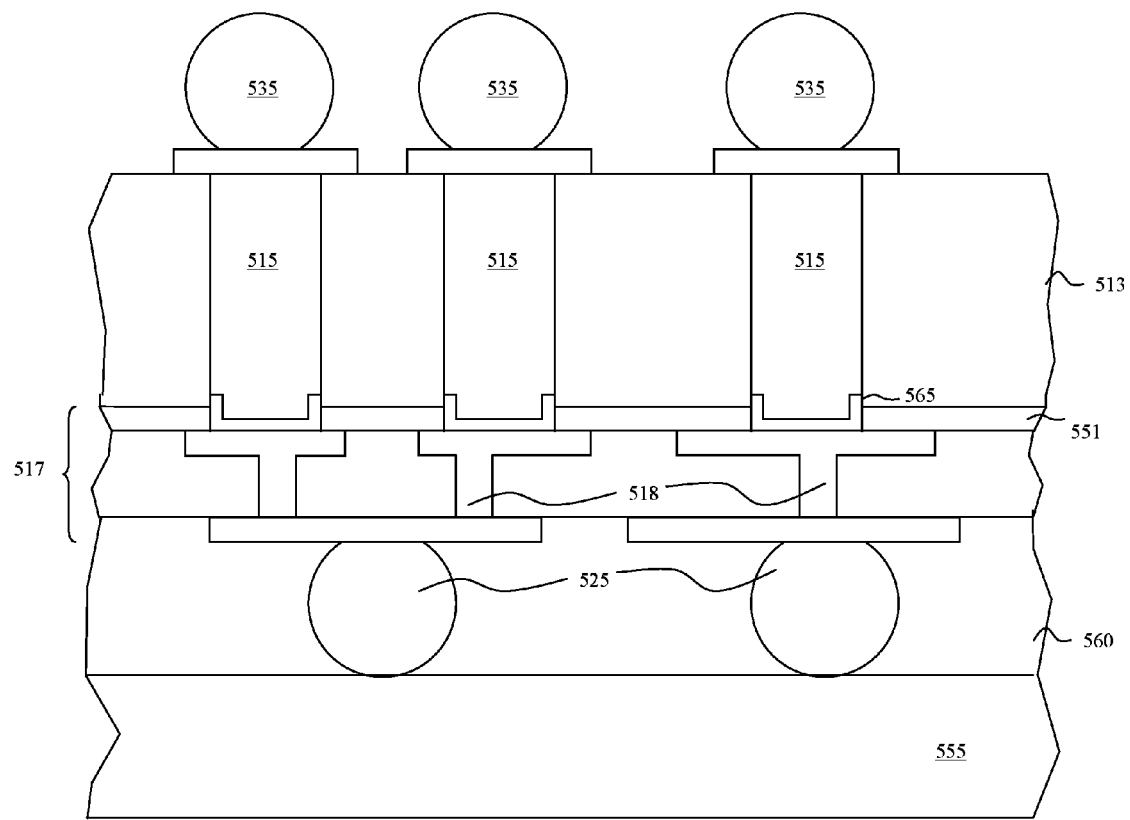

Referring to FIG. 5K, pads (not labeled) and connectors, e.g., bumps 535, can be formed over the electrical connection structures 515. The bumps 535 can be electrically coupled with the bumps 525 through the interconnect structure 517 and the electrical connection structures 515. The pads and bumps 535 can be made of the same or similar materials of the pads and bumps 525 described above in conjunction with FIG. 5B.

Figure 5L:
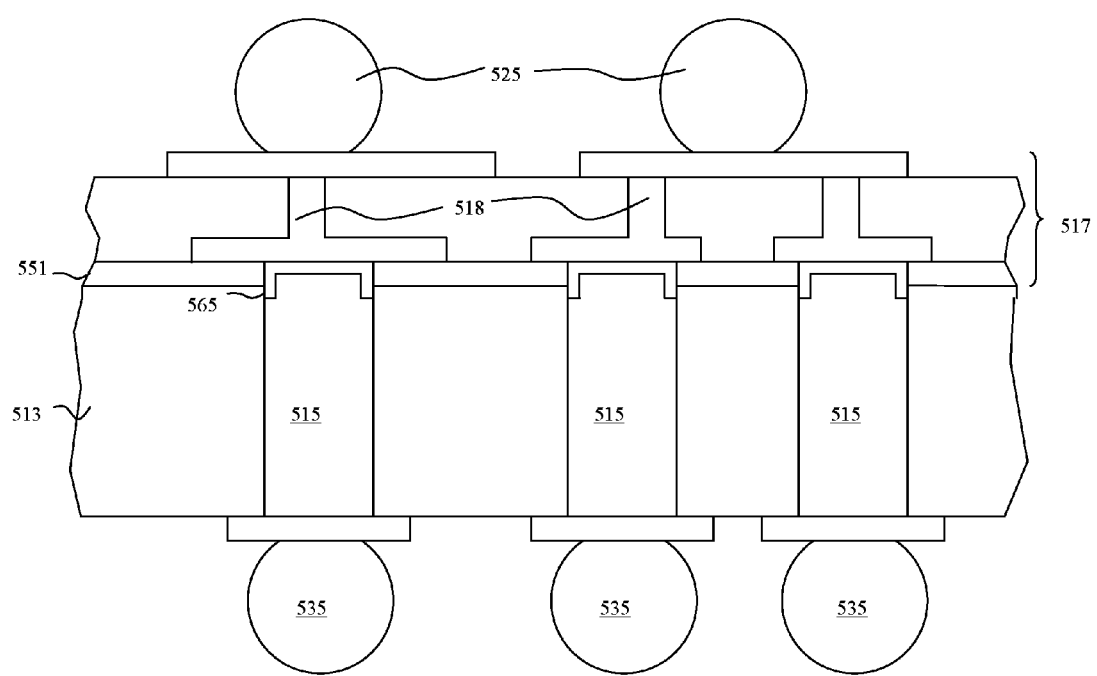

Referring to FIG. 5L, the carrier 555 (shown in FIG. 5K) can be removed and the remaining structure is flipped. In some embodiments, removing the carrier 555 can include removing the glue layer 560 that is disposed between the interconnect structure 517 and the carrier 555. Removing the glue layer 560 can include a mechanical process, a thermal process, a wet etch process, a dry etch process, other known processes for removing the glue layer 560, or any combinations thereof.

In some embodiments, the structure shown in FIG. 5L can be subjected to a dicing process for defining a plurality of interposers. In some embodiments, the dicing process can include a blade sawing process and/or a laser sawing process. In some embodiments forming a package system, at least one integrated circuit (not shown) can be disposed over the interposer. In still other embodiments, a cap layer can be formed, covering the integrated circuit to form any package system described above in conjunction with FIGS. 1-4. It is noted that the method described above in conjunction with FIGS. 5A-5L can be modified to achieve the interposers 110-410 described above in conjunction with FIGS. 1-4, respectively. It is also noted that the processes described above in conjunction with FIGS. 5A-5L does not include a process for forming a through-silicon-via structure. The cost for forming the package system by this application may be reduced.

Figure 6A:
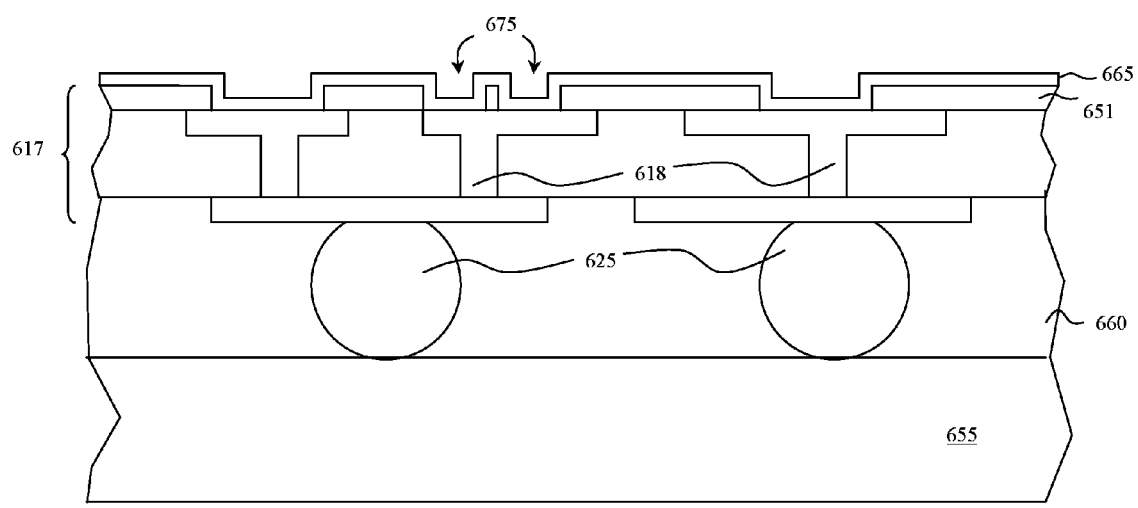
FIGS. 6A-6E are schematic cross-sectional views illustrating several process steps that can optionally replace all or some of the process steps shown in FIGS. 5E-5J to form a structure that is similar to the interposer 310 shown in FIG. 3.

FIGS. 6A-6E are schematic cross-sectional views illustrating several process steps that can optionally replace all or some of the process steps shown in FIGS. 5E-5J to form a structure that is similar to the interposer 310 shown in FIG. 3. Items of FIGS. 6A-6E that are the same or similar items in FIGS. 5E-5J are indicated by the same reference numerals, increased by 100. In FIG. 6A, openings 675 that are configured to accommodate bumps of an integrated circuit can be defined in a dielectric layer 651. At least one BUM layer 665 can be formed substantially conformal over the dielectric layer 651.

Figure 6B:
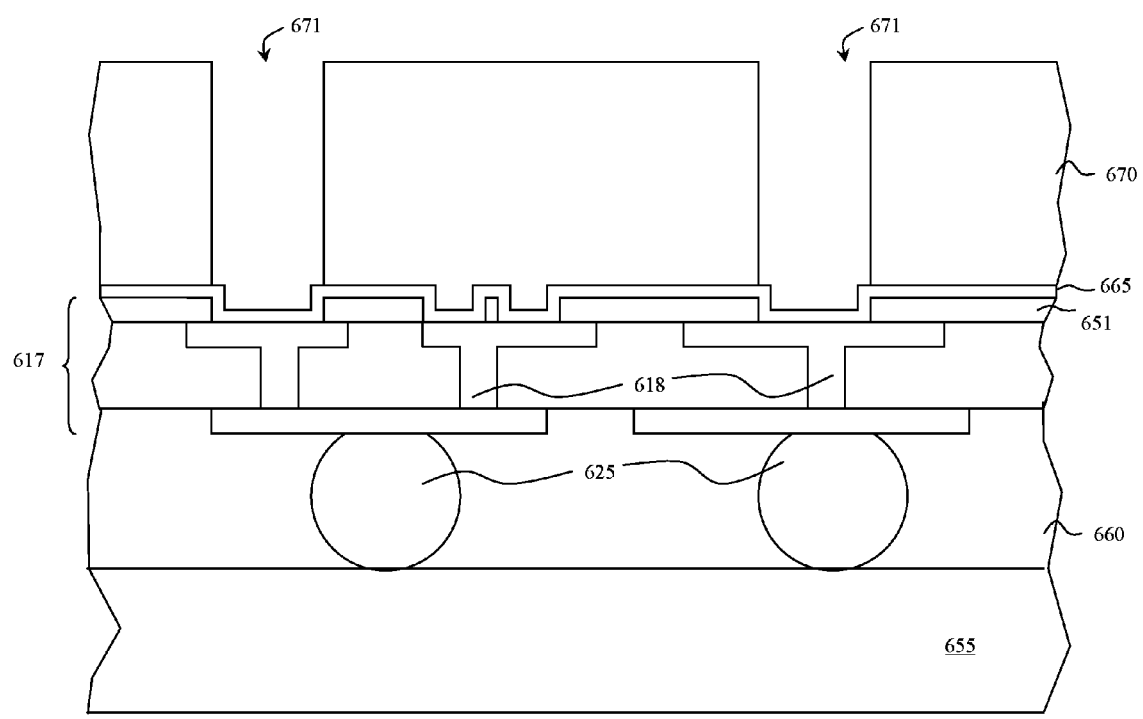

In FIG. 6B, a patterned film 670, e.g., a dry film or a photoresist (PR) layer, can be formed over the UBM layer 665. The patterned film 670 can include openings 671 exposing portions of the UBM layer 665.

Figure 6C:
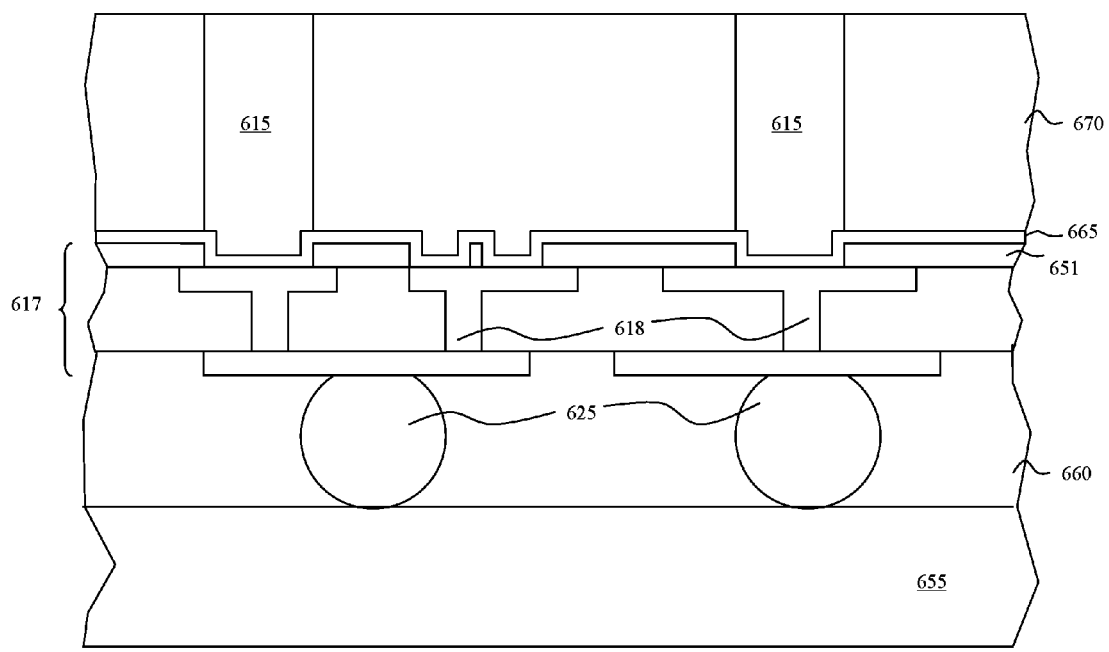

Referring to FIG. 6C, electrical connection structures 615 can each be formed in one of the openings 671. In some embodiments, the process of forming the electrical connection structures 615 can include selectively plating the electrical connection structures 615 from the exposed surface of the UBM layer 665. Since the electrical connection structures 615 can grow from the bottom to the top of the openings 671, each of the electrical connection structures 615 can be free from having a gap therein.

Figure 6D:
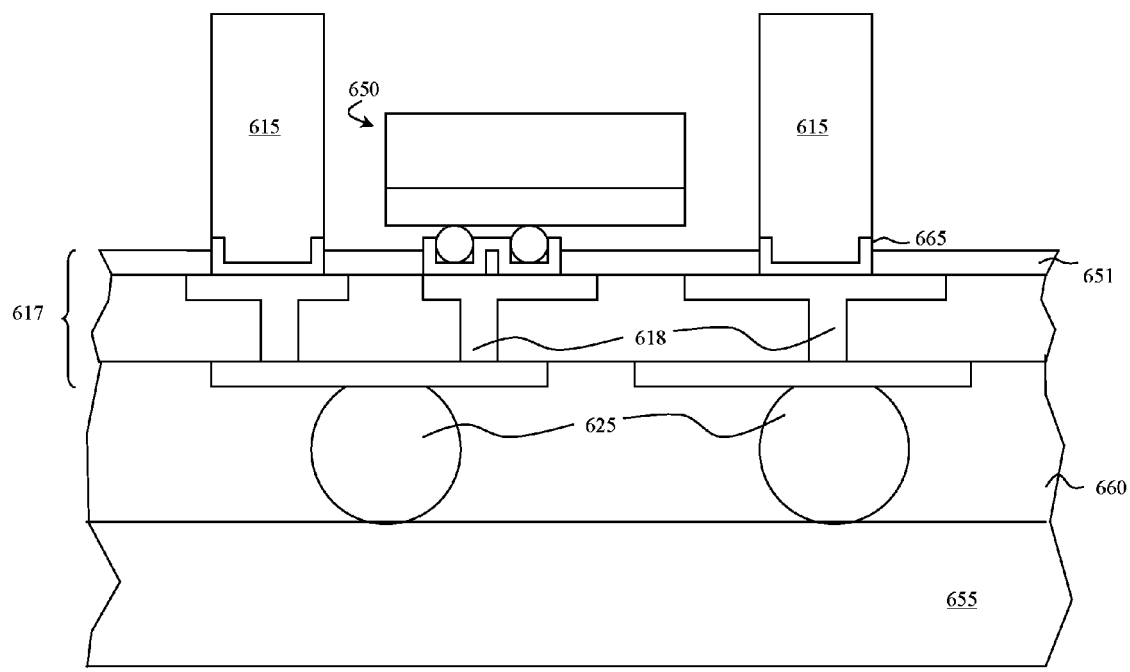

Referring to FIG. 6D, a removing process can remove the patterned film 670. Another removing process can remove portions of the UBM layer 665 that are not covered by the electrical connection structures 615 and bumps of the integrated circuit 650. The bumps of an integrated circuit 650 can be disposed in the openings 675 and electrically coupled with the bumps 625 through the electrical connection structures 618.

Figure 6E:
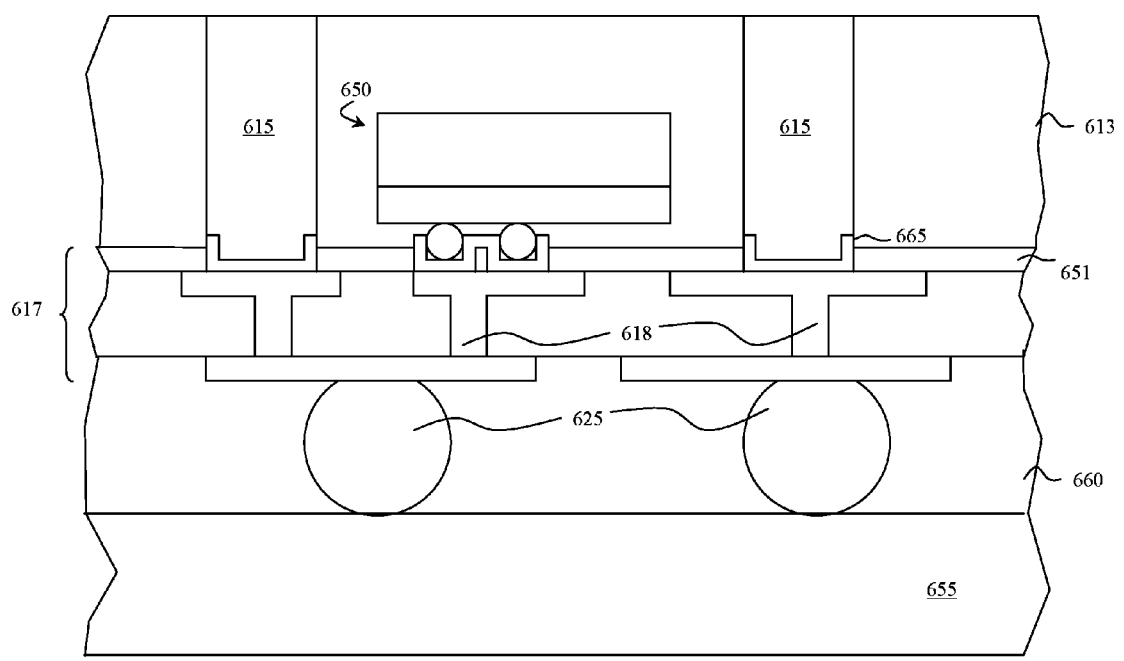

Referring to FIG. 6E, a molding compound layer 613 can be formed, covering the integrated circuit 650. The molding compound layer 613 can be formed in spaces between the electrical connection structures 615. After forming the molding compound layer 613, the process steps described above in conjunction with FIGS. 5K-5L can be performed.

Figure 7:
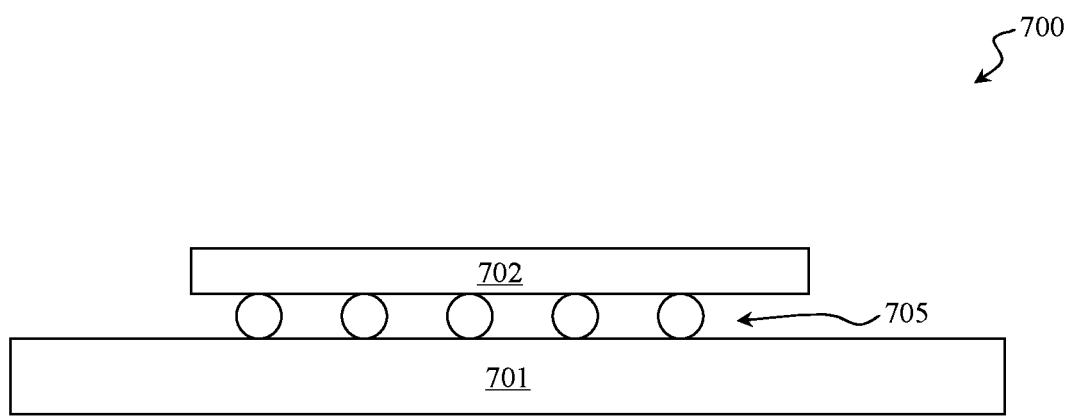
FIG. 7 is a schematic drawing illustrating a system including an exemplary package system disposed over a substrate board.

FIG. 7 is a schematic drawing illustrating a system including an exemplary package system disposed over a substrate board. In FIG. 7, a system 700 can include a package system 702 disposed over a substrate board 701. The substrate board 701 can include a printed circuit board (PCB), a printed wiring board and/or other carrier that is capable of carrying a package system. The package system 702 can be similar to one of the package system 100-400 described above in conjunction with FIGS. 1-4, respectively. The package system 702 can be electrically coupled with the substrate board 701.

In some embodiments, the package system 702 can be electrically and/or thermally coupled with the substrate board 701 through bumps 705. The system 700 can be part of an electronic system such as displays, panels, lighting systems, auto vehicles, entertainment devices, or the like. In some embodiments, the system 700 including the package system 702 can provides an entire system in one IC, so-called system on a chip (SOC) or system on integrated circuit (SOIC) devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package system comprising:
    an interposer comprising:
        at least one molding compound layer including through electrical connection structures through the at least one molding compound layer such that the at least one molding compound layer directly contacts an entire circumference of each of the through electrical connection structures; and
        a first interconnect structure disposed over a first surface of the at least one molding compound layer and electrically coupled with the through electrical connection structures;
    a first integrated circuit die disposed over the interposer, the first integrated circuit die being electrically coupled with the first interconnect structure; and
    a second integrated circuit die disposed in the at least one molding compound layer wherein the at least one molding compound layer extends laterally on opposing sides of the second integrated circuit die.

2. The package system of claim 1, wherein the through electrical connection structures are disposed straight through the at least one molding compound layer.

3. The package system of claim 1, wherein the interposer further comprises:
    a second interconnect structure disposed under a second surface of the at least one molding compound layer that is opposite to the first surface.

4. The package system of claim 3, wherein a metallic line pitch of the second interconnect structure is larger than a metallic line pitch of the first interconnect structure.

5. The package system of claim 1, wherein each of the through electrical connection structures comprises:
    a barrier structure disposed at least partially around at least one side edge of a conductive material.

6. The package system of claim 1, further comprising:
    a cap layer covering the first integrated circuit die, wherein a coefficient of thermal expansion (CTE) of the cap layer is substantially equal to a CTE of the at least one molding compound layer to not cause delamination.

7. A package system comprising:
    an interposer comprising:
        at least one molding compound layer;
        a first interconnect structure disposed over a first surface of the at least one molding compound layer;
        a second interconnect structure disposed under a second surface of the at least one molding compound layer that is opposite to the first surface, the first interconnect structure and the second interconnect structure being redistribution layers; and through via structures extending through the at least one molding compound layer between the first interconnect structure and the second interconnect structure and electrically coupling electrical contacts of the second interconnect structure to respective electrical contacts of the first interconnect structure, the through via structures having an under bump metallization (UBM) layer, a shape of the UBM layer corresponding to a shape of the respective through via structures in a plan view, an entire circumference of each of the through via structures being in direct contact with the at least one molding compound layer; and a first integrated circuit die disposed over the first interconnect structure, the first integrated circuit die being electrically coupled with the first interconnect structure.

8. The package system of claim 7, wherein a metallic line pitch of the second interconnect structure is larger than a metallic line pitch of the first interconnect structure.

9. The package system of claim 7, further comprising:
a second integrated circuit die electrically coupled with the first interconnect structure, wherein the at least one molding compound layer is disposed at least partially around at least one side edge of the second integrated circuit die.

10. The package system of claim 9, wherein the second integrated circuit die is disposed within the at least one molding compound layer.

11. The package system of claim 7, wherein each of the through via structures comprises:
a barrier structure disposed at least partially around at least one side edge of an electrical connection structure.

12. The package system of claim 7, further comprising:
a cap layer covering the first integrated circuit die, wherein a coefficient of thermal expansion (CTE) of the cap layer is substantially equal to a CTE of the at least one molding compound layer to not cause delamination.

13. A package system comprising:
an interposer comprising:
at least one molding compound layer including through electrical connection structures through the at least one molding compound layer such that all sidewalls of each of the through electrical connection structures are directly contacting the at least one molding compound layer, wherein the at least one molding compound layer has a first coefficient of thermal expansion (CTE); and
a first interconnect structure disposed over a first surface of the at least one molding compound layer and electrically coupled with the plurality of through electrical connection structures;
a first integrated circuit disposed over the interposer, the first integrated circuit being electrically coupled with the first interconnect structure;
an underfill material disposed between the interposer and the first integrated circuit, wherein the underfill material has a second CTE and the second CTE is substantially equal to the first CTE to not cause delamination; and
a cap layer disposed over the interposer, the cap layer covering the first integrated circuit, wherein the cap layer has a third CTE and the third CTE is substantially equal to the first CTE to not cause delamination.

14. The package system of claim 13, wherein the through electrical connection structures are disposed straight through the at least one molding compound layer.

15. The package system of claim 13, wherein the interposer further comprises:
a second interconnect structure disposed under a second surface of the at least one molding compound layer that is opposite to the first surface, wherein a metallic line pitch of the second interconnect structure is larger than a metallic line pitch of the first interconnect structure.

16. The package system of claim 13, further comprising:
a second integrated circuit electrically coupled with the first interconnect structure, wherein the at least one molding compound layer is disposed at least partially around at least one side edge of the second integrated circuit.

17. The package system of claim 16, wherein the second integrated circuit is disposed within the at least one molding compound layer.

18. The package system of claim 13, wherein each of the through electrical connection structures comprises:
a barrier structure disposed at least partially around at least one side edge of an electrical connection structure.

19. A package system comprising:
an interposer comprising:
at least one molding compound layer;
a first interconnect structure disposed over a first surface of the at least one molding compound layer;
a second interconnect structure disposed under a second surface of the at least one molding compound layer that is opposite to the first surface, the first interconnect structure and the second interconnect structure being redistribution layers;
a plurality of through vias extending through the at least one molding compound layer between the first interconnect structure and the second interconnect structure and electrically coupling electrical contacts of the second interconnect structure to respective electrical contacts of the first interconnect structure, the plurality of through vias having an under bump metallization (UBM) layer, a shape of the UBM layer corresponding to a shape of the respective through vias in a plan view; and
a plurality of barrier structures each of which is disposed at least partially around at least one side edge of one of the plurality of through vias; and
a first integrated circuit die disposed over the first interconnect structure, the first integrated circuit die being electrically coupled with the first interconnect structure.

20. The package system of claim 19, further comprising:
a second integrated circuit die electrically coupled with the first interconnect structure, wherein the at least one molding compound layer is disposed at least partially around at least one side edge of the second integrated circuit die.

21. The package system of claim 19, wherein the second integrated circuit die is disposed within the at least one molding compound layer.

* * * * *